United States Patent
Ezaki et al.

(10) Patent No.: US 10,355,188 B2
(45) Date of Patent: Jul. 16, 2019

(54) LED LAMP HEAT SINK

(71) Applicant: Kaneka Corporation, Osaka (JP)

(72) Inventors: Toshiaki Ezaki, Osaka (JP); Kazuaki Matsumoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 64 days.

(21) Appl. No.: 15/520,709

(22) PCT Filed: Oct. 23, 2015

(86) PCT No.: PCT/JP2015/005325
§ 371 (c)(1),
(2) Date: Apr. 20, 2017

(87) PCT Pub. No.: WO2016/063540
PCT Pub. Date: Apr. 28, 2016

(65) Prior Publication Data
US 2017/0317257 A1    Nov. 2, 2017

(30) Foreign Application Priority Data
Oct. 23, 2014 (JP) ................. 2014-216403

(51) Int. Cl.
| | |
|---|---|
| *C09K 5/14* | (2006.01) |
| *C08L 67/02* | (2006.01) |
| *H01L 33/64* | (2010.01) |
| *F28F 21/02* | (2006.01) |
| *C08K 7/00* | (2006.01) |
| *C08L 67/00* | (2006.01) |
| *H01L 23/373* | (2006.01) |
| *F28F 21/06* | (2006.01) |

(52) U.S. Cl.
CPC .............. *H01L 33/641* (2013.01); *C08K 7/00* (2013.01); *C08L 67/00* (2013.01); *C08L 67/02* (2013.01); *C09K 5/14* (2013.01); *F28F 21/02* (2013.01); *F28F 21/06* (2013.01); *H01L 23/373* (2013.01); *H01L 33/64* (2013.01); *H01L 2924/0002* (2013.01)

(58) Field of Classification Search
CPC . C09K 5/14; C08L 67/02; H01L 33/64; F28F 21/02
USPC ........................................................ 524/496
See application file for complete search history.

(56) References Cited

U.S. PATENT DOCUMENTS

2006/0151751 A1* 7/2006 Iizuka .................... C08K 11/00
252/500

FOREIGN PATENT DOCUMENTS

| EP | 3190636 A1 | 7/2017 |
|---|---|---|
| JP | 2001060413 A | 3/2001 |
| JP | 2011061157 A | 3/2011 |
| JP | 5225558 B2 | 7/2013 |

OTHER PUBLICATIONS

Extended European Search Report issued in European application No. 15852182.3; dated May 3, 2018 (6 pages).
International Preliminary Report on Patentability issued in International Application No. PCT/JP2015/005325; dated Apr. 25, 2017 (7 pages).
International Search Report issued in International Application No. PCT/JP2015/005325; dated Dec. 15, 2015 (3 pages).

* cited by examiner

*Primary Examiner* — Deve E Valdez
(74) *Attorney, Agent, or Firm* — Osha Liang LLP (57) ABSTRACT

The present invention provides an LED lamp heat sink which has excellent thermal conductivity and moldability, is light in weight, and can be produced at low cost. The LED lamp heat sink is partially or wholly made of a thermally conductive resin composition and cools an LED module. The thermally conductive resin composition contains at least: 10 to 50 wt. % of thermoplastic polyester resin (A) having a number average molecular weight of 12,000 to 70,000; 10 to 50 wt. % of polyester-polyether copolymer (B); and 40 to 70 wt. % of scale-like graphite (C) having a fixed carbon content of 98 wt. % or more and an aspect ratio of 21 or more. Specific gravity of the thermally conductive resin composition is 1.7 to 2.0. Heat conductivity of the thermally conductive resin composition in a surface direction is 15 W/(m·K) or more.

21 Claims, 4 Drawing Sheets

LED LAMP HEAT SINK

TECHNICAL FIELD

The present invention relates to an LED lamp heat sink made of a thermally conductive resin composition. More specifically, the present invention relates to an LED lamp heat sink which is lower in specific gravity than a heat sink made of metal and may contribute to a weight reduction and energy saving.

BACKGROUND ART

Since electric and electronic devices have been reduced in size and highly integrated, heat generation of mounting components and a temperature increase of use environment become significant. Therefore, there is an increasing demand for the improvement of a heat radiation property of a component. Currently, metals and ceramics having high heat conductivity are used especially for heat radiating members of car members and high-power LEDs.

General-purpose resin, metal (such as aluminum) having high thermal conductivity, and the like have been used for conventional car LED lamp heat sinks. However, since the general-purpose resin is low in thermal conductivity, there is a problem that the general-purpose resin cannot adequately cool an LED module. Further, the metal such as aluminum is high in specific gravity and requires a post-processing step for improving the heat radiation property. In addition, since production is performed by die casting, there are problems that the degree of freedom in shape is low, the manufacturing cost is high, the durability of a die is low, and the like. Therefore, there is a demand for a resin material which is high in thermal conductivity, is light in weight, has excellent moldability, and can be produced at low cost.

Disclosed as a method of giving the thermal conductivity to resin is a method of adding a highly thermally conductive filler, such as graphite, to the resin.

PTL 1 discloses a resin composition having excellent thermal conductivity by adding specific graphite particles to resin.

PTL 2 discloses an electrically conductive resin composition containing thermoplastic resin and graphite powder in which an aspect ratio of 70% or more of particles of the graphite powder is three or less.

PTL 3 discloses an LED lamp heat sink formed by combining thermally conductive resin and metal having high heat conductivity. However, according to this technology, a filler needs to be highly filled for giving the thermal conductivity, so that there are problems that flowability extremely deteriorates, and molding may become difficult.

CITATION LIST

Patent Literature

PTL 1: Japanese Patent No. 5225558
PTL 2: Japanese Laid-Open Patent Application Publication No. 2001-60413
PTL 3: Japanese Laid-Open Patent Application Publication No. 2011-61157

SUMMARY OF INVENTION

Technical Problem

An object of the present invention is to provide an LED lamp heat sink which has excellent thermal conductivity and moldability, is light in weight, and can be produced at low cost using an easily available material.

Solution to Problem

The present inventors have diligently studied to solve the above problems. As a result, the present inventors have found that a thermally conductive resin composition containing specific thermoplastic polyester resin, specific polyester-polyether copolymer, and graphite having a specific shape is excellent in thermal conductivity and moldability and therefore is suitable for an LED lamp heat sink. Thus, the present invention was made. To be specific, the present invention is shown by items 1) to 20) below.

1) An LED lamp heat sink partially or wholly made of a thermally conductive resin composition and configured to cool an LED module, wherein: the thermally conductive resin composition contains at least 10 to 50 wt. % of a thermoplastic polyester resin (A) having a number average molecular weight of 12,000 to 70,000, 10 to 50 wt. % of a polyester-polyether copolymer (B), and 40 to 70 wt. % of scale-like graphite (C) having a fixed carbon content of 98 wt. % or more and an aspect ratio of 21 or more; specific gravity of the thermally conductive resin composition is 1.7 to 2.0; and heat conductivity of the thermally conductive resin composition in a surface direction is 15 W/(m·K) or more.

2) The LED lamp heat sink according to the above 1), wherein a volume average particle diameter of the scale-like graphite (C) contained in the LED lamp heat sink is 1 to 500 μm.

3) The LED lamp heat sink according to the above 1) or 2), wherein the polyester-polyether copolymer (B) is made of 95 to 45 wt. % of an aromatic polyester unit and 5 to 55 wt. % of a modified polyether unit.

4) The LED lamp heat sink according to the above 3), wherein the modified polyether unit is a modified polyether unit represented by general formula 1 below, Chemical Formula 1

General Formula (1)

where: -A- denotes —O—, —S—, —SO—, —SO$_2$—, —CO—, an alkylene group having a carbon number of 1 to 20, or an alkylidene group having a carbon number of 6 to 20; each of $R^1$, $R^2$, $R^3$, $R^4$, $R^5$, $R^6$, $R^7$, and $R^8$ denotes hydrogen atom, halogen atom, or monovalent hydrocarbon group having a carbon number of 1 to 5; each of $R^9$ and $R^{10}$ denotes divalent hydrocarbon group having a carbon number of 1 to 5; each of m and n denotes the number of repeating units of an oxyalkylene unit and is an integer of one or more; and a number average of m+n is 2 to 50.

5) The LED lamp heat sink according to the above 3) or 4), wherein the aromatic polyester unit is at least one selected from the group consisting of a polyethylene terephthalate unit, a polybutylene terephthalate unit, and a polypropylene terephthalate unit.

6) The LED lamp heat sink according to any one of the above 1) to 5), wherein the thermoplastic polyester resin (A) is at least one selected from the group consisting of polybutylene terephthalate and polyethylene terephthalate.

7) The LED lamp heat sink according to any one of the above 1) to 6), wherein the heat conductivity of the thermally conductive resin composition in a thickness direction is 1.0 W/(m·K) or more.

8) The LED lamp heat sink according to any one of the above 1) to 7), further including a member made of any one of a good conductor metal and a carbon material.

9) The LED lamp heat sink according to the above 8), wherein: the good conductor metal is a metal selected from the group consisting of aluminum, copper, magnesium, and alloys of these metals; and the heat conductivity of the good conductor metal is 40 W/(m·K) or more.

10) The LED lamp heat sink according to the above 8) or 9), wherein: the carbon material is a graphite sheet; and the heat conductivity of the carbon material in the surface direction is 500 W/(m·K) or more.

11) The LED lamp heat sink according to any one of the above 8) to 10), wherein: the member made of any one of the good conductor metal and the carbon material is arranged at a heat receiving surface side of the LED lamp heat sink; and the member made of any one of the good conductor metal and the carbon material is joined to a member made of the thermally conductive resin composition by insert molding, ultrasonic welding, heat seal, or vibration welding.

12) The LED lamp heat sink according to any one of the above 8) to 11), further including a thermal interface material having the heat conductivity of 0.5 W/(m·K) or more, wherein the thermal interface material is arranged between the member made of any one of the good conductor metal and the carbon material and a member made of the thermally conductive resin composition.

13) The LED lamp heat sink according to any one of the above 1) to 12), further including a member made of a resin or resin composition having an insulation property.

14) The LED lamp heat sink according to any one of the above 1) to 13), wherein: the heat sink includes a gate mark and a board portion; and a ratio of a thickness of the board portion to a thickness of the gate mark is 2 or more.

15) The LED lamp heat sink according to the above 14), wherein the gate mark is one of two or more gate marks.

16) The LED lamp heat sink according to any one of the above 1) to 15), wherein the LED lamp heat sink serves as a car LED lamp heat sink.

17) The LED lamp heat sink according to the above 16), wherein the LED lamp heat sink serves as a car LED rear lamp heat sink.

18) The LED lamp heat sink according to the above 16), wherein the LED lamp heat sink serves as a car LED front lamp heat sink.

19) The LED lamp heat sink according to the above 16), wherein the LED lamp heat sink serves as a car LED head lamp heat sink.

20) A method of producing the heat sink according to any one of the above 1) to 19), including the step of producing the heat sink by injection molding of the thermally conductive resin composition.

21) The method according to the above 20), further including the step of producing the thermally conductive resin composition by melting and kneading, wherein: the scale-like graphite (C) before the melting and kneading has a volume average particle diameter of 1 to 700 μm, the fixed carbon content of 98 mass % or more, and the aspect ratio of 21 or more.

Advantageous Effects of Invention

An LED lamp heat sink of the present invention contains specific thermoplastic polyester resin (A), polyester-polyether copolymer (B), and specific graphite particles (C). With this, the LED lamp heat sink of the present invention is excellent in thermal conductivity and moldability (flowability), is light in weight, and can be produced at low cost using an easily available material.

DESCRIPTION OF EMBODIMENTS

An LED lamp heat sink of the present invention is a heat sink which is partially or wholly made of a below-described thermally conductive resin composition and is used to cool an LED (light emitting diode) module. The LED lamp heat sink of the present invention may be any heat sink as long as it includes a board and a fin. The LED lamp heat sink of the present invention can be suitably used especially as a car LED lamp heat sink. Vehicle LED lamps can be roughly classified into interior lamps and exterior lamps. Examples of the interior lamps include a room lamp and a map lamp, and examples of the exterior lamps include a rear lamp, a front lamp, and a head lamp. Specifically, examples of the rear lamp include a tail lamp, a stop lamp, a rear turn signal lamp, a rear fog lamp, a high mount stop lamp, a back lamp, and a number plate lamp, and examples of the front lamp include a front fog lamp, a front turn signal lamp, a front positioning lamp, a side turn signal lamp, a day lamp, and a fashion lamp. The LED lamp heat sink of the present invention is suitably used for the rear lamp, the front lamp, and the head lamp among the above car LED lamps since each of the rear lamp, the front lamp, and the head lamp uses a high brightness LED module and requires a heat radiation property. Further, the LED lamp heat sink of the present invention is preferably used for the tail lamp, the stop lamp, the fog lamp, the positioning lamp, the turn signal lamp, the day lamp, and the head lamp.

Power consumption of each LED in the car LED lamp varies depending on use. Further, a plurality of LED modules may be used. Each of the rear lamp and the front lamp uses an LED module of typically 0.1 to 15 W, preferably 0.1 to 10 W, more preferably 0.1 to 8 W, further preferably 0.1 to 5 W, and especially preferably 0.1 to 3 W. Further, the head lamp uses an LED module of 1 W or more, preferably 5 to 40 W, more preferably 10 to 30 W, further preferably 10 to 25 W, and especially preferably 10 to 20 W.

It should be noted that a main purpose of the present invention is to provide an excellent car LED lamp heat sink, but the use of the LED lamp heat sink of the present invention is not limited to cars. For example, the LED lamp heat sink of the present invention is also useful as an LED lamp heat sink for other vehicles such as airplanes and motorcycles. In addition, the LED lamp heat sink of the present invention can be used for portable or mobile electronic devices.

Thermoplastic Polyester Resin (A)

Examples of the thermoplastic polyester resin (A) of the present invention include: amorphous polyester resin, such as amorphous semi-aromatic polyester and amorphous wholly aromatic polyester; and crystalline polyester resin, such as crystalline semi-aromatic polyester and crystalline wholly aromatic polyester. These thermoplastic polyester resins may be used alone or in combination of two or more.

Among the thermoplastic polyester resins, a thermoplastic resin which is partially or wholly crystalline or liquid crystalline is preferable. This is because the heat conductivity of the obtained resin composition tends to be high, and scale-like graphite can be easily contained in the resin. The crystalline or liquid crystalline thermoplastic resin may be wholly crystalline or may be partially crystalline or liquid crystalline, such as a case where only specific blocks in molecules of block or graft copolymer resin are crystalline or liquid crystalline. The degree of crystallinity of the resin is not especially limited. As the thermoplastic resin, a polymer alloy of amorphous resin and crystalline or liquid crystalline resin may be used. The degree of crystallinity of the resin is not especially limited.

Among the thermoplastic resins each of which is partially or wholly crystalline or liquid crystalline, there is a resin which can be crystallized but may show an amorphous property when the resin is used alone or molded under a specific molding condition. Even in the case of using such resin, the resin may be able to be partially or wholly crystallized by devising a molding method, such as performing a stretch treatment or a post crystallization treatment.

Specific examples of the crystalline polyester resin include: polyethylene terephthalate; polypropylene terephthalate; polybutylene terephthalate; polyethylene-2,6-naphthalate; polybutylene naphthalate; poly 1,4-cyclohexylene dimethylene terephthalate; polyethylene-1,2-bis(phenoxy)ethane-4,4'-dicarboxylate; and crystallinity copolyesters, such as polyethylene isophthalate/terephthalate, polybutylene terephthalate/isophthalate, polybutylene terephthalate/decane dicarboxylate, and polycyclohexane dimethylene terephthalate/isophthalate.

Among these crystalline polyester resins, polyethylene terephthalate, polypropylene terephthalate, polybutylene terephthalate, polyethylene-2,6-naphthalate, polybutylene naphthalate, poly 1,4-cyclohexylene dimethylene terephthalate, and the like are preferable from the viewpoint of moldability, a mechanical property, and the like. Further, polybutylene terephthalate and polyethylene terephthalate are more preferable from the viewpoint that these are inexpensive and easily available.

In the present invention, a number average molecular weight is a value measured in such a manner that: polystyrene is used as standard; a solution containing a target resin at a concentration of 2.5 wt. % is prepared by dissolving the resin in a mixed solvent in which a volume ratio between p-chlorophenol and toluene is 3:8; a high-temperature GPC (Viscotek:350 HT-GPC System) is used; a column temperature is 80° C.; and a refractive index detector (RI) is used as a detector. It should be noted that this measurement method can be used when measuring the number average molecular weight of the thermoplastic polyester resin (A), the number average molecular weight of the polyester-polyether copolymer (B), and the number average molecular weight of a resin component made of the thermoplastic polyester resin (A) and the polyester-polyether copolymer (B).

The number average molecular weight of the thermoplastic polyester resin (A) is preferably 12,000 to 70,000, more preferably 15,000 to 60,000, further preferably 18,000 to 55,000, and especially preferably 20,000 to 40,000. If the number average molecular weight of the thermoplastic polyester resin (A) is less than 12,000, mechanical strength may be low. If the number average molecular weight of the thermoplastic polyester resin (A) is more than 70,000, molding may be difficult. The LED lamp heat sink of the present invention may be produced in such a manner that: a thermally conductive resin composition is produced by melting and kneading the thermoplastic polyester resin (A), the polyester-polyether copolymer (B), the scale-like graphite (C), and other component(s) according to need; and the composition is subjected to injection molding. The number average molecular weight in the present invention may be measured before or after the melting and kneading or before or after the injection molding, but it is preferable that the number average molecular weight be measured after the injection molding.

When the thermally conductive resin composition of the present invention is regarded as 100 wt. %, the content of the thermoplastic polyester resin (A) used in the present invention is 10 to 50 wt. %, preferably 15 to 45 wt. %, and further preferably 15 to 40 wt. %. If the content of the thermoplastic polyester resin (A) is less than 10 wt. %, strength may be low. If the content of the thermoplastic polyester resin (A) is more than 50 wt. %, excellent thermal conductivity may not be realized.

Polyester-Polyether Copolymer (B)

The polyester-polyether copolymer (B) according to the present invention is a block or random copolymer made of a polyester unit and a polyether unit. Examples of the polyether unit include: a polyalkylene oxide unit, such as a polyethylene oxide unit and a polybutylene oxide unit; and a modified polyether unit. It is preferable that the modified polyether unit be represented by general formula (1) below. From the viewpoint of moldability and heat resistance, the polyester-polyether copolymer (B) is preferably a polymer made of 95 to 45 wt. % of an aromatic polyester unit and 5 to 55 wt. % of the modified polyether unit, more preferably a polymer made of 80 to 50 wt. % of the aromatic polyester unit and 20 to 50 wt. % of the modified polyether unit, and further preferably a polymer made of 80 to 60 wt. % of the aromatic polyester unit and 20 to 40 wt. % of the modified polyether unit.

Chemical Formula 2

General Formula (1)

The number average molecular weight of the polyester-polyether copolymer (B) is not especially limited but is preferably 10,000 to 50,000, further preferably 12,000 to 40,000, and especially preferably 15,000 to 30,000. If the number average molecular weight of the polyester-polyether copolymer (B) is less than 10,000, the mechanical strength may be low. If the number average molecular weight of the polyester-polyether copolymer (B) is more than 50,000, the molding may not improve.

When the thermally conductive resin composition of the present invention is regarded as 100 wt. %, the content of the polyester-polyether copolymer (B) used in the present invention is 10 to 50 wt. %, preferably 15 to 45 wt. %, and further preferably 15 to 30 wt. %. If the content of the polyester-polyether copolymer (B) is less than 10 wt. %, the excellent moldability may not be realized. If the content of the polyester-polyether copolymer (B) is more than 50 wt. %, the strength may be low.

A method of producing the polyester-polyether copolymer (B) uses a catalyst containing an antimony compound or a catalyst containing a germanium compound in some cases, and examples of such method include (1) a direct esterification method using three elements that are an aromatic dicarboxylic acid, a diol, and a modified polyether, (2) a transesterification method using three elements that are aromatic dialkyl dicarboxylate, diol, and modified polyether and/or modified polyether ester, (3) a method of adding modified polyether during or after transesterification of aromatic dialkyl dicarboxylate and diol to perform polycondensation, and (4) a method of mixing high-molecular weight aromatic polyester with modified polyether and melting the mixture to perform transesterification under reduced pressure. However, the method of producing the polyester-polyether copolymer (B) is not limited to these. The producing method (4) is preferable from the viewpoint of composition controllability.

Examples of the antimony compound used as the catalyst include antimony trioxide, antimony pentoxide, antimony acetate, and antimony glycoxide. These are used alone or in combination of two or more. Among these antimony compounds, the antimony trioxide is especially preferable. From the viewpoint of the reaction rate and the economic viewpoint, the amount of antimony compound catalyst input at the time of polymerization is preferably 50 to 2,000 wt.ppm of the amount of resin, and more preferably 100 to 1,000 wt.ppm of the amount of resin.

Examples of the germanium compound used as the catalyst include: germanium oxide, such as germanium dioxide; germanium alkoxide, such as germanium tetraethoxide and germanium tetraisopropoxide; germanium hydroxide; alkali metal salt of gelmanium hydroxide; germanium glycolate; germanium chloride; and germanium acetate. These are used alone or in combination of two or more. Among these germanium compounds, the germanium dioxide is especially preferable. From the viewpoint of the reaction rate and the economic viewpoint, the amount of germanium dioxide catalyst input at the time of polymerization is preferably 50 to 2,000 wt.ppm of the amount of resin, and more preferably 100 to 1,000 wt.ppm of the amount of resin.

As the aromatic dicarboxylic acid, terephthalic acid is especially preferable. Other examples of the aromatic dicarboxylic acid include isophthalic acid, diphenyl dicarboxylic acid, and diphenoxy ethane dicarboxylic acid. Together with these aromatic dicarboxylic acids, aromatic oxycarboxylic acid (such as oxybenzoic acid) or aliphatic or alicyclic dicarboxylic acid (such as adipic acid, sebacic acid, and cyclohexane 1,4-dicarboxylic acid) may be used at a low rate (15% or less).

The diol is a low molecular weight glycol component fainting an ester unit and may be a low molecular weight glycol having a carbon number of 2 to 10, and examples thereof include ethylene glycol, trimethylene glycol, tetramethylene glycol, hexanediol, decanediol, and cyclohexane dimethanol. Ethylene glycol, trimethylene glycol, and tetramethylene glycol are especially preferable since these are easily available.

As an alkyl group of the aromatic dialkyl dicarboxylate, a methyl group is preferable from the viewpoint of transesterification reactivity.

Regarding the viscosity of a solution of the high-molecular weight aromatic polyester, from the viewpoint of impact resistance, chemical resistance, and moldability of the resulting molded article, a logarithmic viscosity (IV) in a mixed solvent in which phenol/tetrachloroethane is 1/1 (weight ratio) at 25° C. at a concentration of 0.5 g/dl is preferably 0.3 to 2.0, and further preferably 0.5 to 1.5.

Aromatic Polyester Unit

The aromatic polyester unit used in the present invention is a polymer or copolymer obtained from: an aromatic dicarboxylic acid or its ester-forming derivative; and a diol or its ester-forming derivative. The aromatic polyester unit used in the present invention is typically an alternating polycondensate and is preferably at least one selected from the group consisting of polyethylene terephthalate unit, polybutylene terephthalate unit, and polypropylene terephthalate unit.

Preferable specific examples of the aromatic polyester unit include a polyethylene terephthalate unit, a polyethylene terephthalate copolymer unit, a polybutylene terephthalate unit, a polybutylene terephthalate copolymer unit, a polypropylene terephthalate unit, and a polypropylene terephthalate copolymer unit. More preferably, the aromatic polyester unit is at least one selected from the group consisting of polyethylene terephthalate unit, polybutylene terephthalate unit, and polypropylene terephthalate unit.

Modified Polyether Unit

The modified polyether unit according to the present invention is a unit represented by the above general formula (1), and each of the numbers m and n of repeating units of the oxyalkylene unit in the general formula (1) is an integer of one or more. A number average of (m+n) is preferably 2 to 50, more preferably 10 to 50, and further preferably 18 to 50.

Chemical Formula 3

General Formula (1)

In this formula, -A- denotes —O—, —S—, —SO—, —SO$_2$—, —CO—, alkylene group having a carbon number of 1 to 20, or alkylidene group having a carbon number of 6 to 20. Each of $R^1$, $R^2$, $R^3$, $R^4$, $R^5$, $R^6$, $R^7$, and $R^8$ denotes hydrogen atom, halogen atom, or monovalent hydrocarbon group having a carbon number of 1 to 5. Each of $R^9$ and $R^{10}$ denotes divalent hydrocarbon group having a carbon number of 1 to 5. Each of m and n denotes the number of repeating units of the oxyalkylene unit and is an integer of one or more. The number average of m+n is 2 to 50.

As the modified polyether unit, a unit obtained by removing two terminal hydrogens from a compound represented by a general formula (2) below is preferable from the viewpoint that such unit is easily available. When (m+n) is two, the formula weight of the unit is 314. When (m+n) is 50, the formula weight of the unit is 2,426. Therefore, the molecular weight of the compound represented by the general formula (2) is preferably 316 to 2,430, more preferably 670 to 2,430, further preferably 1,020 to 2,430, and further preferably 1,330 to 2,000.

Chemical Formula 4

General Formula (2)

Scale-Like Graphite (C)

The scale-like graphite (C) used in the present invention is graphite particles having a specific physical property. The scale-like graphite is graphite particles having a thin scale-like appearance. A fixed carbon content of the scale-like graphite (C) is 98 mass % or more, preferably 98.5 mass %, and more preferably 99 mass % or more. If the fixed carbon content is less than 98 mass %, the heat conductivity is low. The fixed carbon content can be measured according to JIS M8511. The fixed carbon content does not change before and after the melting and kneading and before and after the injection molding.

An aspect ratio of the scale-like graphite (C) is 21 or more in the LED lamp heat sink of the present invention. The larger an upper limit of the aspect ratio of the scale-like graphite (C) is, the better. The upper limit of the aspect ratio of the scale-like graphite (C) is not especially limited but is preferably 10,000 or less, more preferably 5,000 or less, and further preferably 3,000 or less. The aspect ratio can be calculated by measuring vertical and horizontal lengths with an electron microscope or the like.

When the thermally conductive resin composition of the present invention is regarded as 100 wt. %, the content of the scale-like graphite (C) is 40 to 70 wt. %, preferably 40 to 65 wt. %, and further preferably 45 to 60 wt. %.

Specific gravity of the thermally conductive resin composition of the present invention is 1.7 to 2.0, and more preferably 1.7 to 1.9. If the specific gravity is less than 1.7, the thermal conductivity is not adequately realized, and the heat radiation property may be inadequate.

In the present invention, the "heat conductivity in a surface direction" denotes the heat conductivity in a direction in which melted resin flows when producing the molded body. Further, the heat conductivity in a direction vertical to the direction in which the resin flows is referred to as the "heat conductivity in a thickness direction." The heat conductivity of the thermally conductive resin composition of the present invention in the surface direction is 15 W/(m·K) or more, preferably 18 W/(m·K) or more, and more preferably 20 W/(m·K) or more. An upper limit of the heat conductivity of the thermally conductive resin composition of the present invention in the surface direction is not especially limited. The larger the upper limit of the heat conductivity of the thermally conductive resin composition of the present invention in the surface direction is, the better.

The upper limit of the heat conductivity of the thermally conductive resin composition of the present invention in the surface direction is typically 100 W/(m·K) or less.

The heat conductivity of the thermally conductive resin composition of the present invention in the thickness direction is not especially limited. The higher the heat conductivity of the thermally conductive resin composition of the present invention in the thickness direction is, the better. The heat conductivity of the thermally conductive resin composition of the present invention in the thickness direction is preferably 1.0 W/(m·K) or more, more preferably 1.5 W/(m·K) or more, and further preferably 2.0 W/(m·K) or more.

A volume average particle diameter of the scale-like graphite (C) contained in the LED lamp heat sink of the present invention is not especially limited but is preferably 1 to 500 μm, more preferably 10 to 400 further preferably 20 to 350 μm, and especially preferably 40 to 300 μm. If the volume average particle diameter is less than 1 μm, the thermal conductivity of the resin composition may be low. As the particle diameter increases, the heat conductivity and the moldability tend to improve. However, if the volume average particle diameter exceeds 500 μm, the strength of the resin composition may be low. The volume average particle diameter can be measured by a laser diffraction method, a light scattering method, or the like.

A particle size distribution of the scale-like graphite (C) is not especially limited. However, a ratio $D_{80}/D_{20}$ of a particle diameter $D_{80}$ when a cumulative volume obtained by measuring the particle size distribution is 80% to a particle diameter $D_{20}$ when the cumulative volume is 20% is preferably 1 to 20, more preferably 1 to 10, and further preferably 1 to 5.

In the thermally conductive resin composition of the present invention, the larger the volume average particle diameter of the scale-like graphite (C) before the melting and kneading is, the better. The volume average particle diameter of the scale-like graphite (C) before the melting and kneading is preferably 1 to 700 more preferably 10 to 650 μm, further preferably 40 to 500 μm, and especially preferably 201 to 40 μm. Further, the aspect ratio is preferably 21 or more. The larger an upper limit of the aspect ratio is, the better. The upper limit of the aspect ratio is not especially limited but is preferably 3,000 or less, more preferably 1,000 or less, and further preferably 500 or less. Generally, graphite tends to be crushed at the time of the melting and kneading and the molding. Therefore, the larger the volume average particle diameter of the scale-like graphite (C) before the melting and kneading is, the larger the volume average particle diameter of the scale-like graphite (C) after the melting and kneading and the injection molding is maintained. In this case, the heat conductivity and the moldability improve.

Figure 5:
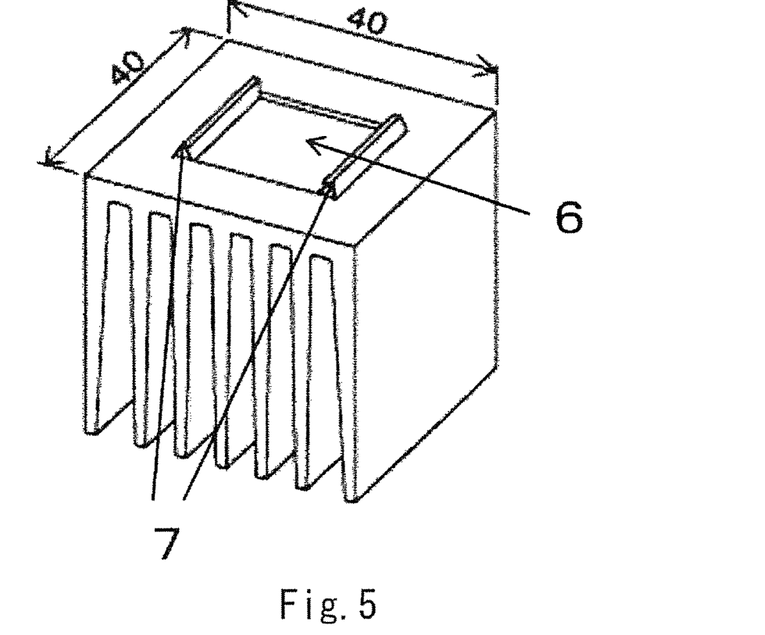
FIG. 5 is a perspective view showing yet another typical example of the LED lamp heat sink of the present invention.
Figure 6:
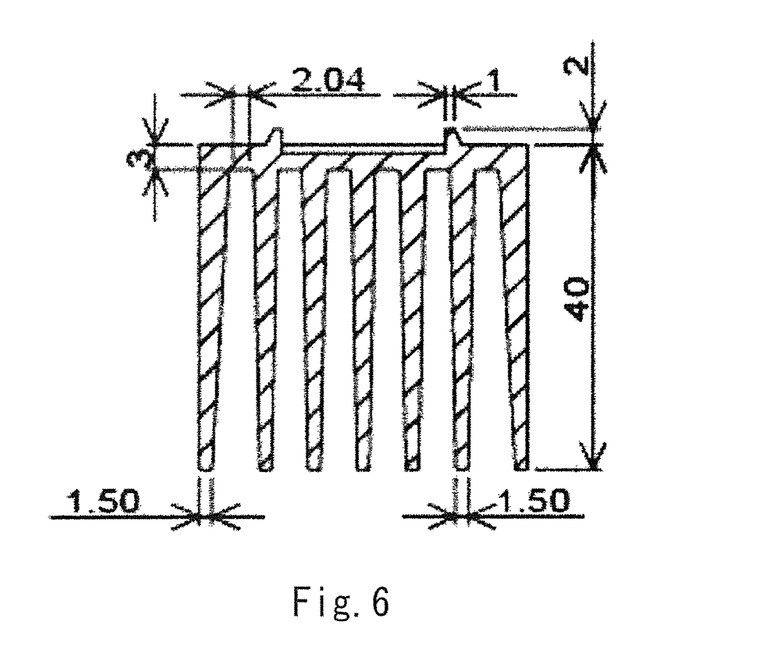
FIG. 6 is a cross-sectional view showing the yet another typical example of the LED lamp heat sink of the present invention.
Figure 7:
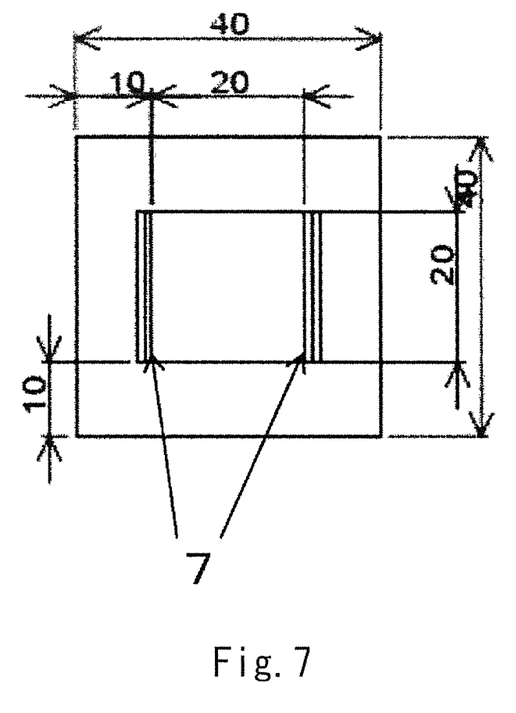
FIG. 7 is a top view showing the yet another typical example of the LED lamp heat sink of the present invention.

The LED lamp heat sink of the present invention may be wholly made of the thermally conductive resin composition and may further include a member made of a thermally conductive material other than the thermally conductive resin composition of the present invention. In the latter case, to increase the heat radiation property, it is preferable that the member made of the thermally conductive resin composition of the present invention be combined with a member made of good conductor metal or a carbon material. A position at which the member made of the good conductor metal or the carbon material is not especially limited. From the viewpoint that the heat radiation can be efficiently performed in such a manner that the heat of the LED module is diffused by the member made of the good conductor metal or the carbon material and is then dissipated by the member made of the thermally conductive resin composition, it is preferable that the member made of the good conductor metal or the carbon material be provided at a heat-receiving surface portion of the LED lamp heat sink as shown in FIGS. 5 to 7.

The good conductor metal is not especially limited. Examples of the good conductor metal include aluminum, alloy containing aluminum (aluminum alloy), copper, alloy containing copper (brass, bronze, aluminum brass, etc.), nickel, chromium, titanium, iron, cobalt, tin, zinc, palladium, silver, stainless steel, magnesium, alloy containing magnesium (magnesium alloy), and manganese. Among these metals, aluminum, copper, magnesium, and alloys of these are preferable from the viewpoint that each of aluminum, copper, magnesium, and alloys of these has heat conductivity of 40 W/(m·K) or more and is easily available.

Examples of the carbon material include a graphite sheet and a carbon fiber composite material. The graphite sheet is preferable since it has a high thermal conductivity. The heat conductivity of the graphite sheet in the surface direction is not especially limited. The higher the heat conductivity of the graphite sheet in the surface direction is, the better. The heat conductivity of the graphite sheet in the surface direction is preferably 500 W/(m·K) or more, more preferably 1,000 W/(m·K) or more, further preferably 1,300 W/(m·K) or more.

A thickness of the member made of the good conductor metal or the carbon material is not especially limited but is preferably 5 mm or less, more preferably 3 mm or less, and further preferably 1 mm or less. Among the carbon materials, the thickness of the graphite sheet is preferably 500 μm or less, more preferably 200 μm or less, and further preferably 100 μm or less. The smaller the thickness is, the better. This is because the weight reduction can be realized.

A shape of the member made of the good conductor metal or the carbon material is not especially limited. Examples of the shape of the member made of the good conductor metal or the carbon material include a flat plate shape, a curved plate shape, a rod shape, a tubular shape, and a block shape. The shape of the member made of the good conductor metal or the carbon material may be a combination of these shapes. Further, the shape of the member made of the good conductor metal or the carbon material may include a through hole, a bent portion, and/or the like.

A shape of a surface of the member made of the good conductor metal or the carbon material is not especially limited. Examples of the surface of the member made of the good conductor metal or the carbon material include a flat surface, a curved surface, a concave-convex surface, and a surface having a pointed portion.

The surface of the member made of the good conductor metal may be subjected to a surface treatment from the viewpoint of adhesive strength between this metal member and the resin member and adhesion therebetween. A surface treatment method is not especially limited. Examples of the surface treatment method include: fine roughening by a special chemical liquid or physical polishing; formation of a film by anodic oxidation or an organic compound; and primer coat by an adhesive or the like. Examples of a metal surface treatment include metal surface treatment technologies described in Japanese Patent Nos. 4,527,196 and 5,302,315.

Examples of a method of joining and fixing the member made of the good conductor metal or the carbon material and the member made of the thermally conductive resin composition include insert molding, adhesive, vibration welding, ultrasonic welding, and heat seal. Among these joining methods, the insert molding, the ultrasonic welding, the heat seal, and the vibration welding are preferable from the viewpoint of stable productivity and low production cost. Further, the insert molding is preferable since the production can be easily performed.

The vibration frequency when performing the vibration welding is preferably about 100 to 300 Hz, and the vibration frequency when performing the ultrasonic welding is preferably 10 to 50 kHz. Further, the total number of vibrations in the vibration welding is preferably 300 to 10,000, and the total number of vibrations in the ultrasound welding is preferably 10,000 to 150,000.

A thermal interface material in the present invention denotes a material which is used to fill a gap between two materials or to cause two materials to tightly adhere to each other and has thermal conductivity. When the member made of the good conductor metal or the carbon material is combined with the member made of the thermally conductive resin composition, the gap between these members is filled with the thermal interface material. With this, the heat radiation property can be improved. The thermal interface material is not especially limited, and the heat conductivity thereof is not limited. However, from the viewpoint of the heat radiation property, the thermal interface material having the thermal conductivity of 0.5 W/(m·K) or more is preferable. Specific examples of the thermal interface material include a heat radiation sheet, thermally conductive grease, and a thermally conductive adhesive.

To obtain the insulation property, the car LED lamp heat sink of the present invention may further include a member made of ceramics or a member made of resin or resin composition having the insulation property. It is preferable that the car LED lamp heat sink of the present invention be combined with the member made of the resin or resin composition having the insulation property since the insulation property can be obtained at low cost. This combining method is not especially limited. Examples of the combining method include: a method using integral molding such as insert molding or two-color molding; and a method of separately producing an insulating member and combining the insulating member with the heat sink by an adhesive, vibration welding, ultrasonic welding, heat seal, or the like.

Figure 1:
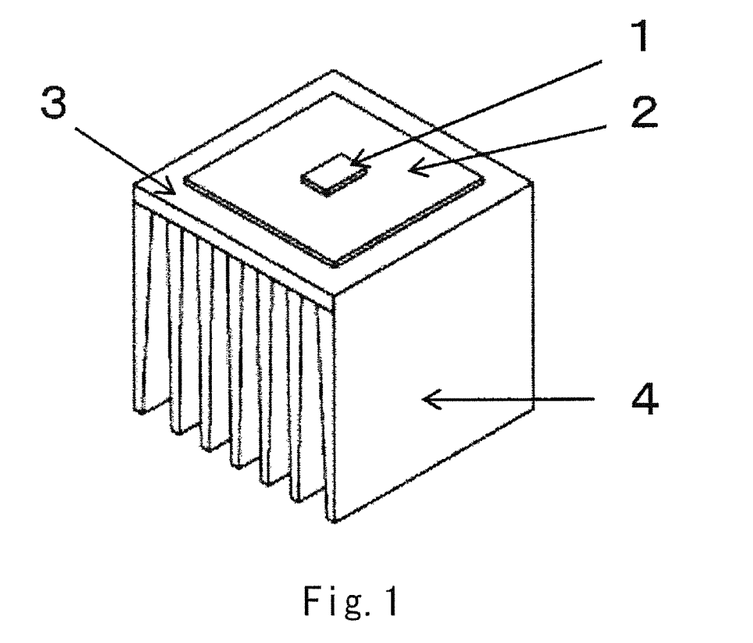
FIG. 1 is a perspective view showing a typical example of an LED lamp heat sink of the present invention.
Figure 2:
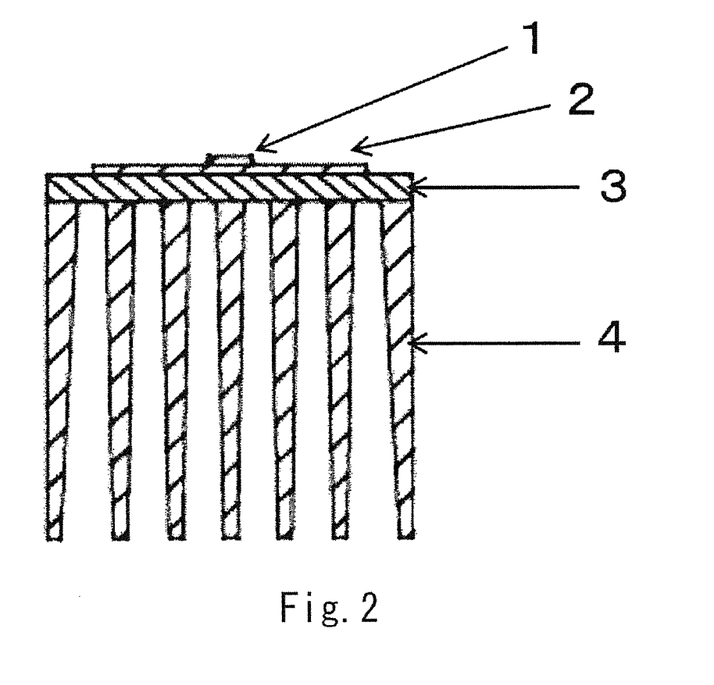
FIG. 2 is a cross-sectional view showing the typical example of the LED lamp heat sink of the present invention.

The shape of the car LED lamp heat sink of the present invention is not especially limited, and one typical example thereof is shown in FIGS. 1 and 2. FIG. 1 is a perspective view, and FIG. 2 is a cross-sectional view. The heat sink shown in FIGS. 1 and 2 includes a heat sink board 3 and a heat sink fin 4. A circuit substrate 2 and an LED module 1 are arranged on an upper surface of the board 3. The heat sink fin 4 includes a plurality of flat plate-shaped members arranged in parallel with one another. Each of the flat plate-shaped members extends in a vertical direction from a lower surface of the heat sink board 3. According to this heat sink, the heat conductivity of the heat sink board portion in a thickness direction is made high. With this, the heat of the LED module is efficiently transferred to the fin portion. Thus, the heat radiation property can be improved. Therefore, it is preferable to design the heat sink such that the heat sink has a shape described below. It is preferable to design the heat sink such that resin is supplied into a die cavity through a gate (inlet) that is narrow relative to the thickness of the heat sink, that is, it is preferable to design the heat sink such that a ratio (heat sink thickness/gate mark thickness) of the thickness of the heat sink to the thickness of a gate mark (shown by reference sign 5 in FIG. 3) formed at the heat sink is 2 or more. The ratio of the thickness of the heat sink to the thickness of the gate mark is more preferably 3 or more and further preferably 5 or more. The thickness of the gate mark herein may denote the diameter of the gate mark. The thickness of the heat sink herein denotes a thickness other than the thickness of the fin portion and is not especially limited but is preferably the thickness of the heat sink board portion. When the ratio of the thickness of the heat sink to the thickness of the gate mark is 2 or more, the thermally conductive filler containing the scale-like graphite (C) can be oriented in the thickness direction of the heat sink, and therefore, the heat conductivity of the heat sink in the thickness direction can be efficiently increased.

The type of the gate is not especially limited. Examples of the gate include a direct gate, a side gate, a pinpoint gate, a film gate, a disc gate, a ring gate, a fan gate, a tab gate, a submarine gate, and a hot runner gate. The pinpoint gate, the film gate, and the like are preferable from the viewpoint that the thermally conductive filler containing the scale-like graphite (C) is easily oriented in the thickness direction of the heat sink.

The position of the gate mark is not especially limited. From the viewpoint of the heat radiation property and the moldability, it is preferable that the gate mark be provided at a portion other than the fin portion.

The number of gate marks is not especially limited. From the viewpoint of the heat radiation property and the moldability, the number of gate marks is preferably two or more. When the number of gate marks is two or more, the heat conductivity of a weld portion in the thickness direction can be increased, the weld portion being generated when supplying the resin. Thus, the heat of the LED module can be efficiently transferred to the fin. When providing two or more gate marks, it is preferable that the gate marks be provided symmetrically relative to the heat sink as much as possible from the viewpoint of the moldability.

The size of the LED lamp heat sink of the present invention is not especially limited. Depending on the type of a lamp to be used, the power consumption of the LED varies, and therefore, the necessary size of the heat sink for heat radiation varies. The length of a longest side of the heat sink for the rear lamp is 100 mm or less, preferably 70 mm or less, more preferably 50 mm or less, and further preferably 40 mm or less. The length of a longest side of the heat sink for the front lamp is 400 mm or less, preferably 200 mm or less, more preferably 100 mm or less, and further preferably 50 mm or less. The length of a longest side of the heat sink for the head lamp is 400 mm or less, preferably 200 mm or less, more preferably 100 mm or less, and further preferably 80 mm or less.

The height of the heat sink fin portion is not especially limited. From the viewpoint that the heat radiation property can be improved, the higher the height of the heat sink fin portion is, the better. In this case, it is preferable that the heat conductivity of the fin portion in the surface direction be higher than the heat conductivity of the board portion in the surface direction. To realize this, the shape of the heat sink is preferably designed such that a ratio of the thickness of the heat sink fin portion to the thickness of the heat sink board portion is one or less. If the thickness of the fin is not uniform, the ratio is calculated by adopting the thickness of a root portion of the fin.

The scale-like graphite used in the present invention may be any of natural graphite and artificial graphite or may be a combination of natural graphite and artificial graphite. The natural graphite is preferable from the viewpoint that the natural graphite is available at low cost. Further, the scale-like graphite used in the present invention may be any of α-graphite and β-graphite or may be a combination of α-graphite and β-graphite.

In addition to the scale-like graphite (C), the thermally conductive resin composition of the present invention may further contain graphite having a particle diameter, a shape, and a property different from those of the scale-like graphite (C) without significantly deteriorating the physical property of the present invention. Specific examples of the shape of such graphite include a fiber shape, a block shape, a sand shape, and a spherical shape.

The LED lamp heat sink of the present invention excels in heat resistance, and a heat deflection temperature (HDT) under a load of 1.82 MPa is 120° C. or more, preferably 130° C. or more, and more preferably 150° C. or more. As the luminance of the LED increases, the temperature of the LED itself tends to increase, and therefore, the HDT needs to be 120° C. or more.

The LED lamp heat sink of the present invention excels in long-term heat resistance. In some cases, the LED lamp heat sink is used at high temperature for a long period of time. Therefore, the higher the long-term heat resistance is, the better. The long-term heat resistance herein denotes a retention rate of bending strength of the heat sink after the heat sink is left in the atmosphere at 150° C. for 2,000 hours (i.e., bending strength after 2,000 hours/initial bending strength). The retention rate of bending strength is preferably 60% or more, more preferably 70% or more, and further preferably 75% or more.

The car LED lamp heat sink of the present invention excels in emissivity. The emissivity of the present invention is obtained by measuring the emissivity of the molded body by using an emissivity measuring device and is 0.60 or more, preferably 0.65 or more, more preferably 0.70 or more, and further preferably 0.75 or more.

The thermally conductive resin composition of the present invention also excels in electromagnetic wave shielding property. An electromagnetic wave shielding effect at a frequency of 100 MHz is preferably 5 dB or more, more preferably 10 dB or more, and further preferably 15 to 60 dB.

In addition to the scale-like graphite (C), the thermally conductive resin composition of the present invention may further contain a thermally conductive filler other than graphite. The shape of the thermally conductive filler is not especially limited. Examples of the shape of the thermally conductive filler include various shapes such as a scale-like shape, a fiber shape, a flake shape, a plate shape, a spherical shape, a particle shape, a fine particle shape, a nano-particle shape, an agglomerated particle shape, a tube shape, a nanotube shape, a wire shape, a rod shape, an irregular shape, a rugby ball shape, a hexahedron shape, a combined particle shape obtained by a combination of a large particle and a fine particle, and a liquid form. Specific examples of the thermally conductive filler include: a metal filler, such as aluminum and nickel; a low melting point alloy having a liquidus temperature of 300° C. or more and a solidus temperature of 150° C. or more and 250° C. or less; metal oxide, such as aluminum oxide, magnesium oxide, silicon oxide, beryllium oxide, copper oxide, and copper suboxide; metal nitride, such as aluminum nitride and silicon nitride; metal carbide, such as silicon carbide; metal carbonate, such as magnesium carbonate; an insulating carbon material, such as diamond; metal hydroxide, such as aluminum hydroxide and magnesium hydroxide; alumina; boron nitride; glass fiber; carbon fiber; potassium titanate whisker; silicon nitride fiber; carbon nanotube; talc; and wollastonite. The amount of thermally conductive filler added is not especially limited. The thermal conductivity improves as the amount of thermally conductive filler added increases. The above inorganic filler may be a natural filler or a synthetic filler. A production area and the like of the natural filler are not especially limited and may be selected suitably.

A known filler other than the above thermally conductive filler may be added to the thermally conductive resin composition of the present invention according to a purpose.

Examples of the filler other than the thermally conductive filler include: inorganic fiber, such as diatomaceous earth powder, basic magnesium silicate, baked clay, fine silica powder, quartz powder, crystalline silica, kaolin, antimony trioxide, fine mica powder, molybdenum disulfide, rock wool, ceramic fiber, and asbestos; and glass filler, such as glass fiber, glass powder, glass cloth, and molten silica. By using these fillers, it is possible to improve the properties (such as the thermal conductivity, the mechanical strength, and the abrasion resistance, which are preferable for utilizing the resin composition) of the resin composition. In addition, an organic filler may also be added to the thermally conductive resin composition of the present invention according to need. Examples of the organic filler include: synthetic fiber, such as paper, pulp, wood, polyamide fiber, aramid fiber, and boron fiber; and resin powder, such as polyolefin powder.

To increase the adhesive property of an interface between the resin and the filler and facilitate workability, the filler used in the present invention may be subjected to a surface treatment using various surface treatment agents, such as silane agent, stearic acid, and acrylic monomer. The surface treatment agent is not especially limited, and known agents such as a silane coupling agent and a titanate coupling agent may be used. Among these, an epoxy group-containing silane coupling agent (such as epoxysilane), an amino group-containing silane coupling agent (such as aminosilane), and polyoxyethylene silane are preferable since these hardly deteriorate the physical property of the resin. The surface treatment method for the filler is not especially limited, and normal treatment methods may be utilized.

The thermally conductive resin composition of the present invention may be alloyed with any known resin, such as epoxy resin, polyolefin resin, bismaleimide resin, polyimide resin, polyether resin, phenol resin, silicone resin, polycarbonate resin, polyamide resin, polyester resin, fluorocarbon resin, acryl resin, melamine resin, urea resin, or urethane resin. Any component as an additive other than the above resin and filler may be added to the thermally conductive resin composition of the present invention according to a purpose without deteriorating the effects of the present invention. Examples of such additive include a reinforcing agent, a thermal stabilizer, an antioxidant, an ultraviolet absorber, an age resister, a thickener, a release agent, a plasticizer, a coupling agent, a flame retardant, a flameproofing agent, an antibacterial agent, a coloring agent, and other auxiliary agents. When the thermoplastic resin is 100 parts by weight in total, the amount of additives used is preferably 0 to 20 parts by weight in total.

Examples of the thermal stabilizer include phosphites, hindered phenols, and thioethers. These may be used alone or in combination of two or more.

Examples of the antioxidant include phosphites, hindered amines, hydroquinones, hindered phenols, and sulfur-containing compounds. These may be used alone or in combination of two or more.

Examples of the ultraviolet absorber include benzophenones, benzotriazoles, salicylate esters, and metallic complex salts. These may be used alone or in combination of two or more.

Examples of the flame retardant include an organic flame retardant, an inorganic flame retardant, and a reactive flame retardant. These may be used alone or in combination of two or more.

Examples of the organic flame retardant include: halogen-based flame retardants, such as a brominated epoxy compound, a brominated alkyl triazine compound, a brominated bisphenol epoxy resin, a brominated bisphenol phenoxy resin, a brominated bisphenol polycarbonate resin, a brominated polystyrene resin, a brominated crosslinked polystyrene resin, a brominated bisphenol cyanurate resin, a brominated polyphenylene ether, a brominated bismaleimide, decabromodiphenyl oxide, tetrabromobisphenol A, and its oligomer; phosphorous flame retardants, such as phosphoester (trimethyl phosphate, triethyl phosphate, tripropyl phosphate, tributyl phosphate, tripentyl phosphate, trihexyl phosphate, tricyclohexyl phosphate, triphenyl phosphate, tricresyl phosphate, trixylenyl phosphate, cresyl diphenyl phosphate, dicresyl phenyl phosphate, dimethyl ethyl phosphate, methyl dibutyl phosphate, ethyl dipropyl phosphate, and hydroxy phenyl diphenyl phosphate), compounds obtained by modifying the phosphoester with various substituents, various condensed phosphoester compounds, and phosphazene derivatives containing phosphorus element and nitrogen element; and polytetrafluoroethylene. These may be used alone or in combination of two or more.

Examples of the inorganic flame retardant include aluminum hydroxide, antimony oxide, magnesium hydroxide, zinc borate, zirconium compound, molybdenum compound, zinc stannate, guanidine salt, silicone compound, and phosphazene compound. These may be used alone or in combination of two or more.

Examples of the reactive flame retardant include tetrabromobisphenol A, dibromophenol glycidyl ether, brominated aromatic triazine, tribromophenol, tetrabromophthalate, tetrachlorophthalic anhydride, dibromoneopentylglycol, poly(pentabromo benzil polyacrylate), chlorendic acid (HET acid), chlorendic anhydride (HET anhydride), brominated phenol glycidyl ether, dibromocresyl glycidyl ether, and an organic phosphorous flame retardant represented by a general formula (3) below (in this formula, n is an integer of 2 to 20). These may be used alone or in combination of two or more.

Chemical Formula 5

General Formula (3)

When adding the flame retardant to the composition of the present invention, it is preferable to also add a flame retardant promoter. Examples of the flame retardant promoter include: antimony compounds, such as bianitmony trioxide, bianitmony tetroxide, bianitmony pentoxide, antimony sodiate, and antimony tartrate; zinc borate; barium metaborate; hydrated alumina; zirconium oxide; ammonium polyphosphate; tin oxide; and iron oxide. These may be used alone or in combination of two or more. Further, silicone oil may be added to improve the flame retardancy.

Examples of the age resister include a naphthylamine compound, a diphenylamine compound, a p-phenylenediamine compound, a quinoline compound, a hydroquinone derivative compound, a monophenol compound, a bisphenol compound, a trisphenol compound, a polyphenol compound, a thiobisphenol compound, a hindered phenol compound, a phosphite compound, an imidazole compound, a dithiocarbamate nickel salt compound, and a phosphate compound. These may be used alone or in combination of two or more.

Examples of the plasticizer include: phthalic esters, such as dimethyl phthalate, diethyl phthalate, dibutyl phthalate, diisobutyl phthalate, dioctyl phthalate, butyl octyl phthalate, di-(2-ethylhexyl) phthalate, diisooctyl phthalate, and diisodecyl phthalate; fatty acid esters, such as dimethyl adipate, diisobutyl adipate, di-(2-ethylhexyl) adipate, diisooctyl adipate, diisodecyl adipate, octyl decyl adipate, di-(2-ethylhexyl) azelate, diisooctyl azelate, diisobutyl azelate, dibutyl sebacate, di-(2-ethylhexyl) sebacate, and diisooctyl sebacate; trimellitic acid esters, such as trimellitic acid isodecyl ester, trimellitic acid octyl ester, trimellitic acid n-octyl ester, and trimellitic acid isononyl ester; di-(2-ethylhexyl) fumarate; diethylene glycol monooleate; glyceryl monoricinoleate; trilauryl phosphate; tristearyl phosphate; tri-(2-ethylhexyl) phosphate; epoxidized soybean oil; and polyether ester. These may be used alone or in combination of two or more.

Examples of the antibacterial agent include: inorganic antibacterial agents, such as a zeolite antibacterial agent (silver zeolite, silver-zinc zeolite, etc.), a silica gel antibacterial agent (silver complex-silica gel, etc.), a glass antibacterial agent, a calcium phosphate antibacterial agent, a zirconium phosphate antibacterial agent, a silicate antibacterial agent (silver-aluminosilicate magnesium, etc.), a titanium oxide antibacterial agent, a ceramic antibacterial agent, and a whisker antibacterial agent; organic antibacterial agents, such as a formaldehyde releasing agent, a halogenated aromatic compound, a load propargyl derivative, a thiocyanate compound, an isothiazolinone derivative, a trihalomethylthio compound, quaternary ammonium salt, a biguanide compound, aldehydes, phenols, pyridine oxide, carbanilide, diphenyl ether, carboxylic acid, and an organic metal compound; an inorganic-organic hybrid antibacterial agent; and a natural antibacterial agent. These may be used alone or in combination of two or more.

Examples of the coloring agent include organic dye, inorganic pigment, and organic pigment. These may be used alone or in combination of two or more.

A method of producing the thermoplastic resin composition of the present invention is not especially limited. For example, the thermoplastic resin composition of the present invention may be produced in such a manner that after the above components, additives, and the like are dried, melting and kneading are performed by a melt kneader, such as a single-screw extruder or a twin-screw extruder. A kneading temperature is determined based on the type of the thermoplastic polyester resin (A). Further, if a component added is liquid, it may be added to the melt kneader by a liquid supply pump or the like in the middle of the production.

EXAMPLES

Next, the present invention will be explained in more detail using Production Examples, Examples, and Comparative Examples. However, the present invention is not limited to these Examples.

Raw material components used for preparing the resin composition are shown below.

Thermoplastic polyester resin (A)

Polyethylene terephthalate (A-1): Novapex PBKII (product name) produced by Mitsubishi Chemical Corporation, Number average molecular weight of 28,000

Polyethylene terephthalate (A-2): GS-100 (product name) produced by Mitsubishi Chemical Corporation, Number average molecular weight of 22,500

Polybutylene terephthalate (A-3): NOVADURAN5008L produced by Mitsubishi Engineering-Plastics Corporation, Number average molecular weight of 18,900

Polyester-polyether copolymer (B)

The polyester-polyether copolymer used was produced by a method below.

To be specific, the polyester-polyether copolymer (B-1) was prepared in such a manner that: 70 parts by weight of polyethylene terephthalate (PET) (IV=0.65) produced by an antimony catalyst and having an antimony metal concentration of 200 wt.ppm, antimony trioxide that is 160 ppm relative to PET and polyether, 0.2 parts by weight of antioxidant (Irganox 1010 produced by Ciba Specialty Chemicals), and 30 parts by weight of polyether that is Bisol 18EN explained below were put in a reactor including a stirrer and a gas discharge port; the mixture was maintained at 270° C. for two hours; pressure reduction was performed by a vacuum pump; and the mixture was maintained at one ton for three hours and then taken out. The number average molecular weight of the obtained polyester-polyether copolymer was 25,400.

In the Bisol 18EN, the number average of (m+n) in the general formula (2) is 18.

Graphite (C)

Scale-like graphite (C-1): CPB-80 (product name) produced by Chuetsu Graphite Works Co., Ltd., Volume average particle diameter of 300 μm, Fixed carbon content of 99.9 wt. %, Aspect ratio of 100

Scale-like graphite (C-2): BF-40AK (product name) produced by Chuetsu Graphite Works Co., Ltd., Volume average particle diameter of 50 μm, Fixed carbon content of 99.9 wt. %, Aspect ratio of 30

Scale-like graphite (C-3): MD-100C (product name) produced by Chuetsu Graphite Works Co., Ltd., Volume average particle diameter of 170 μm, Fixed carbon content of 93.6 wt. %, Aspect ratio of 80

Filler (D)

Glass fiber: T187H/PL (product name) produced Nippon Electric Glass Co., Ltd., Heat conductivity of 1.0 W/(m·K), Fiber diameter of 13 μm, Number average fiber length of 3.0 mm Evaluation Method Molding Condition A molding temperature of a molded body used for evaluation varies depending on thermoplastic polyester resin used. The injection molding was performed at a molding temperature shown in Table 1. Further, the molding was performed at a fixed injection speed of 150 mm/s under fixed injection pressure of 150 MPa.

Volume Average Particle Diameter of Graphite

The volume average particle diameter of the graphite was measured by a Microtrac particle size distribution measuring device (MICROTRAC MT3300EXII produced by Nikkiso Co., Ltd.) in such a manner that: graphite particles were input to a water solvent; and the mixture was then subjected to ultrasonic vibration for 60 seconds. The volume average particle diameter of the graphite particles after the molding was measured in such a manner that: a heat sink (gate diameter of 1 mm; columnar gate) shown in FIGS. 3 and 4 was produced from pellets of the prepared thermally conductive resin composition by an injection molding machine (Si-30IV produced by Toyo Machinery & Metal Co., Ltd.); the heat sink was baked at 620° C. for an hour; only the graphite particles contained in the heat sink were taken out; and the volume average particle diameter of the graphite particles were measured.

Aspect Ratio of Graphite

The aspect ratio of the graphite was calculated using an average value of longest diameters of 100 graphite particles and an average value of shortest diameters of the 100 graphite particles by a scanning electron microscope (SEM) (JSM-6060LA produced by JEOL Ltd.). The aspect ratio of the graphite particle after the molding was calculated by the same method as above using the heat sink shown in FIGS. 3 and 4.

Number Average Molecular Weight

Figure 3:
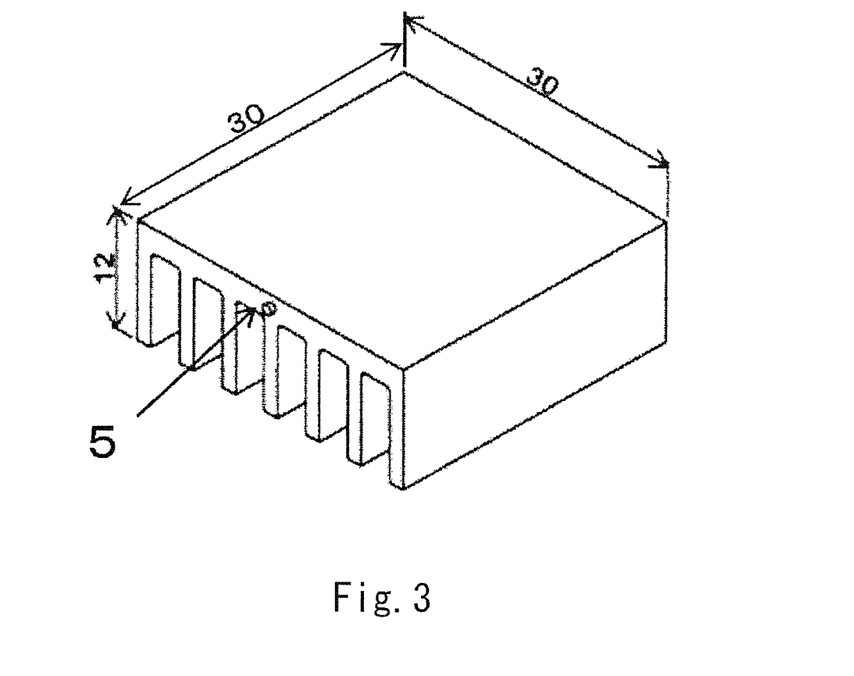
FIG. 3 is a perspective view showing another typical example of the LED lamp heat sink of the present invention.
Figure 4:
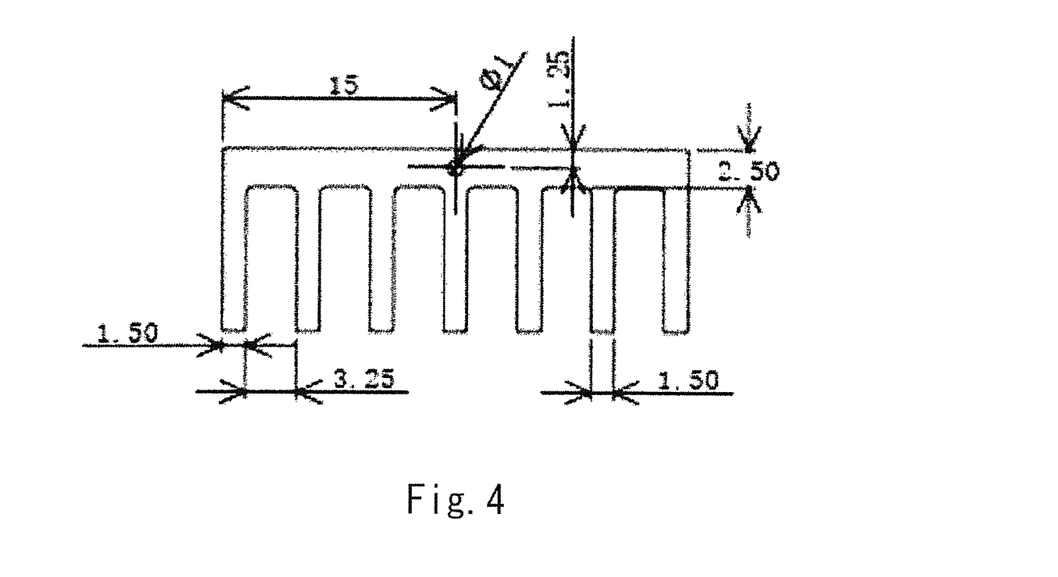
FIG. 4 is a cross-sectional view showing the another typical example of the LED lamp heat sink of the present invention.

A part of the heat sink shown in FIGS. 3 and 4 was produced by the injection molding and dissolved at a concentration of 0.25 wt. % in a mixed solvent in which a volume ratio between p-chlorophenol (produced by Tokyo Chemical Industry Co., Ltd.) and toluene was 3:8. Then, only the thermoplastic resin was extracted. Thus, a sample was prepared. Using polystyrene as a standard substance, a sample solution was prepared in the same manner as above. The number average molecular weight was measured by a high-temperature GPC (350 HT-GPC System produced by Viscotek) under conditions that a column temperature was 80° C., and a flow velocity was 1.00 mL/min. A refractive index detector (RI) was used as a detector. Thus, the number average molecular weight of the entire resin component made of the thermoplastic polyester resin (A) and polyester-polyether copolymer (B) contained in the thermally conductive resin composition was measured.

Extrusion/Kneading Temperature

The thermally conductive resin composition is produced by extrusion, melting, and kneading. An extrusion/kneading temperature during the production varies depending on the thermoplastic polyester resin. The extrusion and kneading were performed at an extrusion barrel temperature shown in Table 1.

Heat Conductivity

A molded body having a diameter of 26 mm and a thickness of 1 mm was produced by an injection molding machine (Si-15IV produced by Toyo Machinery & Metal Co., Ltd.) using pellets of the obtained thermally conductive resin composition. Then, the heat conductivity in the surface direction and the heat conductivity in the thickness direction in the atmosphere at room temperature were measured according to ASTM E 1461 by a laser flash method heat conductivity measuring device (LFA447 produced by NETZSCH).

Heat Conductivity of Heat Sink

Two types of heat sinks, which were different in gate diameter and gate shape shown in FIGS. 3 and 4 from each other, were produced by injection molding. The heat conductivity of the board portion of the obtained heat sink in the thickness direction was measured.

Gate diameter of heat Sink 1:1 mm, Columnar Gate

Gate diameter of heat sink 2:2 mm×2 mm, quadrangular prism-shaped gate

Specific Gravity

The specific gravity of the heat sink shown in FIGS. 3 and 4 was measured by an underwater substitution method according to ISO1183.

Moldability

A molded body was produced using pellets of the obtained thermally conductive resin composition by an injection molding machine (Si-30IV produced by Toyo Machinery & Metal Co., Ltd.) in such a manner that resin was supplied to a spiral tube having a width of 10 mm and a thickness of 1 mm (pitch of 5 mm) from a center of the spiral tube at a molding temperature and die temperature shown in Table 1 and determined in accordance with the thermoplastic resin at injection pressure of 150 MPa and an injection speed of 150 mm/s. Then, a flow length of melted resin of the molded body was measured. The moldability was determined as follows: "Excellent" denotes that the flow length was 100 mm or more; "Good" denotes that the flow length was 50 to 100 mm; and "Bad" denotes that the flow length was less than 50 mm.

Heat Resistance: HDT (High Load)

A test piece having a size of 80 mm×40 mm×4 mm in thickness was produced by an injection molding machine (Si-30IV produced by Toyo Machinery & Metal Co., Ltd.), and the heat resistance of the test piece was measured according to ISO75.

Long-Term Heat Resistance

Using a small high-temperature chamber (ST-120 produced by ESPEC), the test piece was left in the atmosphere at 150° C. for 2,000 hours. The bending strength of the test piece before the experiment and the bending strength of the test piece after the experiment were measured according to ISO178. Then, a retention rate of bending strength (bending strength after 2,000 hours/initial bending strength) was calculated.

Emissivity

The emissivity of the molded body having a size of 80 mm×40 mm×4 mm in thickness was measured by an emissivity measuring device (TSS-5X produced by Japan Sensor Corporation).

Heat Radiation of Heat Sink

The heat sink shown in FIGS. 5 to 7 was produced by an injection molding machine (Si-100 produced by Toyo Machinery & Metal Co., Ltd.) using pellets of the obtained thermally conductive resin composition. A thermal interface material having the heat conductivity of 2 W/(m~K) was uniformly applied to an entire surface of a recess on an upper surface portion of the heat sink of FIG. 5 so as to have a thickness of 0.1 mm or less. Then, an aluminum plate having a size of 20 mm×20 mm×1 mm in thickness was placed on an upper surface of the thermal interface material. After that, a rib portion of the heat sink was subjected to ultrasonic welding, so that the aluminum plate was fixed. Then, a heat generating body having a size of 5 mm×5 mm×2 mm in thickness was placed at a center of the aluminum plate. The heat sink was fixed with the fin facing downward, and 10 W was applied to the heat generating body in a 20° C. atmosphere. After the heat generating body was left for two hours, the temperature thereof was measured.

TABLE 1

| Thermoplastic resin | Extrusion, melting, and kneading Barrel temperature (° C.) | Molding Cylinder temperature (° C.) | Molding Die temperature (° C.) |
|---|---|---|---|
| A-1 | 280 | 280 | 120 |
| A-1 and B-1 | 280 | 280 | 100 |
| A-2 and B-1 | 280 | 280 | 100 |
| A-2 and B-1 | 280 | 280 | 100 |
| A-3 and B-1 | 260 | 280 | 100 |

Examples 1 to 6

The thermoplastic polyester resins (A-1) to (A-3) and the polyester-polyether copolymer (B-1) were dried by a hot air drier at 140° C. for four hours. Then, mixtures of the components shown in Table 2 were prepared based on weight ratios shown in Table 2. Then, 0.3 parts by weight of a phenol-based stabilizer (AO-60 produced by ADEKA CORPORATION) and 0.3 parts by weight of a phosphorus-based antioxidant (ADK STAB PEP-36 produced by ADEKA CORPORATION) were added to 100 parts by weight of each of the mixtures. Each of the resulting mixtures was melted and kneaded by a 25 mm same direction rotation completely-meshing type twin screw extruder MFU25TW-60HG-NH-1300 produced by Technovel Corporation at a discharge rate of 20 kg/h, a screw revolution speed of 150 rpm, and an extrusion barrel temperature shown in Table 1. Thus, resin composition pellets were obtained.

The molded bodies were produced by injection molding using the obtained resin composition pellets, and various evaluations were performed. The volume average particle diameters, aspect ratios of the graphite particles contained in the heat sinks, and various physical property values are shown in Table 2.

Comparative Examples 1 and 2

Comparative Examples 1 and 2 are the same as Example 1 except for the formulations shown in Table 3. The volume average particle diameters, aspect ratios of the graphite particles contained in the heat sinks, and various physical property values were shown in Table 3.

TABLE 2

| | | | Examples 1 | Examples 2 | Examples 3 | Examples 4 | Examples 5 | Examples 6 |
|---|---|---|---|---|---|---|---|---|
| Polyester resin | A-1 | Mass % | 30 | 20 | | | 20 | 20 |
| | A-2 | | | | 20 | | | |
| | A-3 | | | | | 20 | | |
| Polyester-polyether copolymer | B-1 | | 15 | 15 | 15 | 15 | 15 | 15 |
| Graphite | C-1 | | 50 | 60 | 60 | 60 | 60 | |
| | C-2 | | | | | | | 60 |
| | C-3 | | | | | | | |
| Glass fiber | D | | 5 | 5 | 5 | 5 | 5 | 5 |
| Specific gravity | | | 1.7 | 1.8 | 1.8 | 1.8 | 1.8 | 1.8 |
| Number average molecular weight | | | 21,500 | 20,800 | 19,700 | 18,800 | 20,700 | 20,500 |
| Volume average particle diameter of graphite particle contained in heat sink | | μm | 73 | 68 | 71 | 65 | 72 | 37 |
| Aspect ratio of graphite particle contained in heat sink | | | 300 | 350 | 300 | 400 | 350 | 250 |
| Fixed carbon content | | % | 99.9 | 99.9 | 99.9 | 99.9 | 99.9 | 99.9 |
| Heat conductivity in surface direction | | W/(m · K) | 22.1 | 31.3 | 31.0 | 30.2 | 31.3 | 28.2 |
| Heat conductivity in thickness direction | | | 2.3 | 3.3 | 3.4 | 3.2 | 3.3 | 3.0 |
| Heat conductivity of board portion of heat sink 1 in thickness direction | | | 2.7 | 4.0 | 4.1 | 3.9 | | 3.6 |
| Heat conductivity of board portion of heat sink 2 in thickness direction | | | | | | | 3.5 | |
| Moldability | | | Excellent | Excellent | Excellent | Excellent | Excellent | Good |
| HDT | | ° C. | 220 | 230 | 228 | 212 | 230 | 231 |
| Emissivity | | | 0.77 | 0.73 | 0.73 | 0.72 | 0.73 | 0.73 |
| Heat radiation property of heat sink | | ° C. | 89.1 | 83.4 | 82.9 | 83.8 | — | 84.5 |
| Long-term heat resistance (Retention rate of bending strength) | | % | 79 | 82 | 81 | 80 | 82 | 82 |

TABLE 3

| | | | Comparative Examples 1 | Comparative Examples 2 |
|---|---|---|---|---|
| Polyester resin | A-1 | Mass % | 35 | 20 |
| | A-2 | | | |
| | A-3 | | | |
| Polyester-polyether copolymer | B-1 | | | 15 |

TABLE 3-continued

|  |  | Comparative Examples | |
|---|---|---|---|
|  |  | 1 | 2 |
| Graphite | C-1 | 60 |  |
|  | C-2 |  |  |
|  | C-3 |  | 60 |
| Glass fiber | D | 5 | 5 |
| Specific gravity |  | 1.8 | 1.8 |
| Number average molecular weight |  | 22,200 | 20,900 |
| Volume average particle diameter of graphite particle contained in heat sink | μm | 69 | 53 |
| Aspect ratio of graphite particle contained in heat sink |  | 300 | 300 |
| Fixed carbon content | % | 99.9 | 93.6 |
| Heat conductivity in surface direction | W/(m · K) | 30.2 | 25.7 |
| Heat conductivity in thickness direction |  | 3.3 | 2.8 |
| Heat conductivity of board portion of heat sink 1 in thickness direction |  | 3.9 | 3.3 |
| Heat conductivity of board portion of heat sink 2 in thickness direction |  |  |  |
| Moldability |  | Bad | Bad |
| HDT | ° C. | 239 | 229 |
| Emissivity |  | 0.72 | 0.73 |
| Heat radiation property of heat sink | ° C. | — | — |
| Long-term heat resistance (Retention rate of bending strength) | % | 83 | 81 |

It is clear from the results of Example 2 and Comparative Example 1 that by adding the polyester-polyether copolymer, the moldability is improved while maintaining the heat conductivity and the long-term heat resistance.

It is clear from the results of Example 2 and Comparative Example 2 that although the amount of graphite contained is the same therebetween, the heat conductivity and moldability of Example 2 are higher than those of Comparative Example 2 since the fixed carbon content of the scale-like graphite in Example 2 is 98 wt. % or more.

It is clear from the results of Examples 2 and 5 that since the ratio of the thickness of the heat sink to the thickness of the gate is 2 or more in Example 2, the heat conductivity of the board portion of the heat sink in the thickness direction is improved in Example 2. With this, the heat of the LED module can be efficiently transferred to the fin portion, so that the temperature of the LED module can be more effectively reduced.

It is clear from Examples 2 and 6 that: the larger the volume average particle diameter of the graphite before melting and kneading is, the larger the volume average particle diameter of the graphite particle contained in the heat sink becomes; and the thermal conductivity and the moldability are improved.

Since the LED lamp heat sink of the present invention has excellent thermal conductivity and moldability and low specific gravity, it can serve as a replacement for, for example, metal having high thermal conductivity. The LED lamp heat sink of the present invention is light in weight, has high degree of freedom in shape, and can be easily produced at low cost. The LED lamp heat sink of the present invention also excels in electromagnetic shielding property and is suitably used in a case where the electromagnetic shielding property is required. Thus, the present invention is suitably used for the car LED lamp heat sinks.

REFERENCE SIGNS LIST

1 LED module
2 circuit substrate
3 heat sink board
4 heat sink fin
5 gate
6 upper surface portion of heat sink
7 rib

The invention claimed is:

1. An LED lamp heat sink configured to cool an LED module, comprising a thermally conductive resin composition, wherein
the LED lamp heat sink is partially or wholly made of the thermally conductive resin composition,
the thermally conductive resin composition comprises, relative to the total weight of the resin composition:
10 to 50 wt. % of a thermoplastic polyester resin (A) having a number average molecular weight of 12,000 to 70,000;
10 to 50 wt. % of a polyester-polyether copolymer (B); and
40 to 70 wt. % of graphite (C) having a fixed carbon content of 98 wt. % or more and an aspect ratio of 21 or more,
specific gravity of the thermally conductive resin composition is 1.7 to 2.0, and
heat conductivity of the thermally conductive resin composition in a surface direction is 15 W/(m·K) or more.

2. The LED lamp heat sink according to claim 1, wherein a volume average particle diameter of the graphite (C) is 1 to 500 μm.

3. The LED lamp heat sink according to claim 1, wherein the polyester-polyether copolymer (B) is made of 95 to 45 wt. % of an aromatic polyester unit and 5 to 55 wt. % of a modified polyether unit.

4. The LED lamp heat sink according to claim 3, wherein the modified polyether unit is a modified polyether unit represented by general formula 1 below, Chemical Formula 1

General Formula (1)

where:
-A- denotes —O—, —S—, —SO—, —SO$_2$—, —CO—, an alkylene group having a carbon number of 1 to 20, or an alkylidene group having a carbon number of 6 to 20;
each of $R^1$, $R^2$, $R^3$, $R^4$, $R^5$, $R^6$, $R^7$, and $R^8$ denotes hydrogen atom, halogen atom, or monovalent hydrocarbon group having a carbon number of 1 to 5;
each of $R^9$ and $R^{10}$ denotes divalent hydrocarbon group having a carbon number of 1 to 5;
each of m and n denotes the number of repeating units of an oxyalkylene unit and is an integer of one or more; and
a number average of m +n is 2 to 50.

5. The LED lamp heat sink according to claim 3, wherein the aromatic polyester unit is at least one selected from the group consisting of a polyethylene terephthalate unit, a polybutylene terephthalate unit, and a polypropylene terephthalate unit.

6. The LED lamp heat sink according to claim 1, wherein the thermoplastic polyester resin (A) is at least one selected from the group consisting of polybutylene terephthalate and polyethylene terephthalate.

7. The LED lamp heat sink according to claim 1, wherein the heat conductivity of the thermally conductive resin composition in a thickness direction is 1.0W/(m·K) or more.

8. The LED lamp heat sink according to claim 1, further comprising a member made of any one of a conductor metal and a carbon material.

9. The LED lamp heat sink according to claim 8, wherein:
the conductor metal is a metal selected from the group consisting of aluminum, copper, magnesium, and alloys of these metals; and
the heat conductivity of the conductor metal is 40 W/(m·K) or more.

10. The LED lamp heat sink according to claim 8, wherein:
the carbon material is a graphite sheet; and
the heat conductivity of the carbon material in the surface direction is 500 W/(m·K) or more.

11. The LED lamp heat sink according to claim 8, wherein:
the member made of any one of the conductor metal and the carbon material is arranged at a heat receiving surface side of the LED lamp heat sink; and
the member made of any one of the conductor metal and the carbon material is joined to a member made of the thermally conductive resin composition by insert molding, ultrasonic welding, heat seal, or vibration welding.

12. The LED lamp heat sink according to claim 8, further comprising a thermal interface material having the heat conductivity of 0.5 W/(m·K) or more, wherein the thermal interface material is arranged between the member made of any one of the conductor metal and the carbon material and a member made of the thermally conductive resin composition.

13. The LED lamp heat sink according to claim 1, further comprising a member made of a resin or resin composition having an insulation property.

14. The LED lamp heat sink according to claim 1, wherein:
the heat sink includes a gate mark and a board portion; and
a ratio of a thickness of the board portion to a thickness of the gate mark is 2 or more.

15. The LED lamp heat sink according to claim 14, wherein the gate mark is one of two or more gate marks.

16. The LED lamp heat sink according to claim 1, wherein the LED lamp heat sink serves as a car LED lamp heat sink.

17. The LED lamp heat sink according to claim 16, wherein the LED lamp heat sink serves as a car LED rear lamp heat sink.

18. The LED lamp heat sink according to claim 16, wherein the LED lamp heat sink serves as a car LED front lamp heat sink.

19. The LED lamp heat sink according to claim 16, wherein the LED lamp heat sink serves as a car LED head lamp heat sink.

20. A method of producing the heat sink according to claim 1, comprising producing the heat sink by injection molding of the thermally conductive resin composition.

21. The method according to claim 20, further comprising producing the thermally conductive resin composition by melting and kneading, wherein
the graphite (C) before the melting and kneading has a volume average particle diameter of 1 to 700 μm, the fixed carbon content of 98 mass % or more, and the aspect ratio of 21 or more.

* * * * *